(12) United States Patent
Doy et al.

(10) Patent No.: US 12,108,223 B2
(45) Date of Patent: Oct. 1, 2024

(54) DRIVER CIRCUITS

(71) Applicant: Cirrus Logic International Semiconductor Ltd., Edinburgh (GB)

(72) Inventors: Anthony S. Doy, Bend, OR (US); Eric J. King, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 18/460,218

(22) Filed: Sep. 1, 2023

(65) Prior Publication Data

US 2023/0412976 A1    Dec. 21, 2023

Related U.S. Application Data

(63) Continuation of application No. 18/101,816, filed on Jan. 26, 2023, now Pat. No. 11,792,569, which is a
(Continued)

(51) Int. Cl.
| | | |
|---|---|---|
| *H04R 3/00* | (2006.01) | |
| *H03F 3/217* | (2006.01) | |
| *H03K 17/687* | (2006.01) | |

(52) U.S. Cl.
CPC .............. *H04R 3/00* (2013.01); *H03K 17/687* (2013.01); *H03F 3/217* (2013.01)

(58) Field of Classification Search
CPC ........ H04R 3/00; H03K 17/687; H03F 3/217; H03F 3/183; H03F 3/187
See application file for complete search history.

(56) References Cited

U.S. PATENT DOCUMENTS 4,725,993 A    2/1988   Owen et al.
6,353,354 B1   3/2002   Detweiler et al.
(Continued)

FOREIGN PATENT DOCUMENTS

| CN | 205725503 U | 11/2016 | | |
| GB | 2446843 A | * 8/2008 | ............. | H02M 3/07 |
| WO | WO-2017127132 A1 | * 7/2017 | ............. | H02M 3/158 |

OTHER PUBLICATIONS

International Search Report and Written Opinion of the International Searching Authority, International Application No. PCT/GB2021/051967, mailed Oct. 7, 2021.
(Continued)

*Primary Examiner* — David L Ton
(74) *Attorney, Agent, or Firm* — Jackson Walker L.L.P.

(57) ABSTRACT

The application describes a switched driver (401) for outputting a drive signal at an output node (402) to drive a load such as a transducer. The driver receives respective high-side and low-side voltages (VinH, VinL) defining an input voltage at first and second input nodes and has connections for first and second capacitors (403H, 403L). A network of switching paths is configured such that each of the first and second capacitors can be selectively charged to the input voltage, the first input node can be selectively coupled to a first node (N1) by a path that include or bypass the first capacitor, and the second input node can be selectively coupled to a second node (N2) by a path that includes or bypasses the second capacitor. The output node (402) can be switched between two switching voltages at the first or second nodes. The driver is selectively operable in different operating modes, where the switching voltages are different in each of said modes.

18 Claims, 5 Drawing Sheets

Related U.S. Application Data continuation of application No. 17/343,479, filed on Jun. 9, 2021, now Pat. No. 11,606,642.

(60) Provisional application No. 63/146,093, filed on Feb. 5, 2021, provisional application No. 63/065,051, filed on Aug. 13, 2020.

(56) References Cited

U.S. PATENT DOCUMENTS

| | | | |
|---|---|---|---|
| 7,518,442 | B1 | 4/2009 | Dijkstra et al. |
| 7,772,924 | B2 * | 8/2010 | Matamura ............ H03F 3/2173 330/10 |
| 8,008,969 | B1 | 8/2011 | Forejt et al. |
| 9,515,617 | B2 | 12/2016 | Hoyerby |
| 9,793,867 | B2 | 10/2017 | Frith et al. |
| 9,806,684 | B2 | 10/2017 | Frith et al. |
| 9,973,157 | B2 | 5/2018 | Frith et al. |
| 10,447,152 | B2 | 10/2019 | Zhang et al. |
| 11,277,129 | B2 | 3/2022 | Thomsen et al. |
| 11,368,151 | B2 | 6/2022 | Melanson et al. |
| 2010/0090764 | A1 | 4/2010 | Buter et al. |
| 2010/0231298 | A1 * | 9/2010 | Norimatsu ............ H03F 3/217 330/251 |
| 2013/0223651 | A1 * | 8/2013 | Hoyerby ................ H03F 3/187 381/120 |
| 2014/0056442 | A1 | 2/2014 | Anazawa |
| 2014/0233763 | A1 | 8/2014 | Atkins et al. |
| 2018/0019666 | A1 | 1/2018 | Zhang et al. |
| 2018/0331660 | A1 | 11/2018 | Hoyerby |
| 2018/0351478 | A1 | 12/2018 | King et al. |
| 2019/0356287 | A1 * | 11/2019 | Lesso ................... H04R 29/001 |
| 2021/0184663 | A1 * | 6/2021 | Xia ......................... H03F 3/183 |
| 2022/0048069 | A1 | 2/2022 | Thomsen et al. |
| 2022/0052687 | A1 | 2/2022 | Melanson et al. |
| 2022/0053267 | A1 | 2/2022 | Doy et al. |

OTHER PUBLICATIONS

Vanhalakka, Juha, "Power Supply for Piezoelectric Actuator Thesis submitted for examination for the degree of Master", Science in Technology EspooSc. (Tech.) Jari Kostamo, May 26, 2014.

International Search Report and Written Opinion of the International Searching Authority, International Application No. PCT/GB2021/052063, mailed Nov. 29, 2021.

Combined Search and Examination Report under Sections 17 and 18(3), UKIPO, Application No. GB2109569.0, mailed Oct. 21, 2021.

International Search Report and Written Opinion of the International Searching Authority, International Application No. PCT/GB2022/051964, mailed Mar. 20, 2023.

* cited by examiner

DRIVER CIRCUITS

The present disclosure is a continuation of U.S. Non-Provisional patent application Ser. No. 18/101,816, filed Jan. 26, 2023, which is a continuation of U.S. Non-Provisional patent application Ser. No. 17/343,479, filed Jun. 9, 2021, issued Mar. 14, 2023 as U.S. Pat. No. 11,606,642, which claims priority to U.S. Provisional Patent Application Ser. No. 63/146,093, filed Feb. 5, 2021, and U.S. Provisional Patent Application Ser. No. 63/065,051, filed Aug. 13, 2020, each of which is incorporated by reference herein in its entirety.

FIELD OF DISCLOSURE

The field of representative embodiments of this disclosure relates to methods, apparatus and/or implementations concerning or relating to driver circuits, and in particular to switching driver circuits as may be used to drive a transducer.

BACKGROUND

Many electronic devices include transducer driver circuitry for driving a transducer with a suitable driving signal, for instance for driving an audio output transducer of the host device or a connected accessory, with an audio driving signal.

In some applications the driver circuit may include a switching amplifier stage, e.g. a class-D amplifier stage or the like, for generating driving signals for driving the transducer. Switching amplifier stages can be relatively power efficient and thus can be advantageously used in some applications. A switching amplifier stage generally operates to switch an output node between defined high and low voltages, with a duty cycle that provides the desired average output voltage over time.

To provide suppression of the switching ripple, some series inductance may be included in the output path. In some implementations the inductance may be provided by the load itself. For instance, for audio applications for driving a conventional cone and voice-coil type loudspeaker, the self-inductance of the voice coil of a loudspeaker may be sufficient. In some implementations, however, it may be advantageous to include an inductor, as a separate component to the load, in the output path. For instance, piezoelectric or ceramic transducers may be advantageously used in some applications, in particular due to their relatively thin form factor. The capacitive nature of such transducers means that it may generally be beneficial to include an inductor in series with the transducer.

In applications where an inductor is included as a separate component in the output path, the inductor should be chosen so as to allow the peak expected current to flow without saturation. In some instances, this can require the inductance to be relatively large, which may be undesirable.

SUMMARY

Embodiments of the present disclosure relate to driving circuits that at least mitigate at least of the above-mentioned problems.

According to an aspect of the disclosure there is provided a driver circuit comprising a first switching driver for generating a first drive signal, the first switching driver comprising:

first and second input nodes for connection to respective high-side and low-side voltages defining an input voltage;

capacitor nodes for connection to first and second capacitors;

a driver output node for outputting the first drive signal; and a network of switching paths;

wherein the network of switching paths is configured such that, in use:

each of the first capacitor and the second capacitor can be selectively connected in series between the first and second input nodes to be charged to the input voltage;

the first input node can be selectively coupled to a first selective boost node by a path that includes the first capacitor in series or by a path which bypasses the first capacitor;

the second input node can be selectively coupled to a second selective boost node by a path that includes the second capacitor in series or by a path which bypasses the second capacitor; and the driver output node can be selectively coupled to the first selective boost node or the second selective boost node;

wherein the first switching driver is selectively operable in a plurality of different operating modes, wherein in each of said operating modes the driver output node is switched between two switching voltages and the switching voltages are different in each of said modes.

In some examples, the first switching driver may be selectably operable in any two or more of:

first mode in which the two switching voltages are said high-side voltage and said low-side voltage;

a second mode in which the two switching voltages are the high-side voltage and a boosted high-side voltage which is greater than the high-side voltage by an amount substantially equal to the input voltage; and a third mode in which the two switching voltages are the low-side voltage and a boosted low-side voltage which is lower than the low-side voltage by an amount substantially equal to the input voltage.

In the first mode, the first switching driver may be operable in two switch states which comprise:

a first state of the first mode in which the first input node is coupled to the first selective boost node by the path which bypasses the first capacitor, the driver output node is connected to the first selective boost node and the first capacitor is connected between the first selective boost node and the second input node; and a second state of the first mode in which the second input node is coupled to the second selective boost node by the path which bypasses the second capacitor, the driver output node is connected to the second selective boost node and the second capacitor is connected between the first selective boost node and the second input node.

If operable in the second mode, the first switching driver may be operable in two switch states which comprise:

a first state of the second mode in which the first input node is coupled to the first selective boost node by the path that includes the first capacitor in series, the driver output node is connected to the first selective boost node and the second capacitor is connected between the first selective boost node and the second input node; and a second state of the second mode in which the first input node is coupled to the first selective boost node by the path which bypasses the first capacitor, the driver output node is connected to the first selective boost node and the first capacitor is connected between the first selective boost node and the second input node.

If operable in the third mode, the first switching driver may be operable in two switch states which comprise:
- a first state of the third mode in which the second input node is coupled to second selective boost node by the path that bypasses the second capacitor, the driver output node is connected to the second selective boost node and the second capacitor is connected between the first selective boost node and the second input node; and
- a second state of the third mode in which the second input node is coupled to the second selective boost node by the path that includes the second capacitor in series, the driver output node is connected to the second selective boost node and the first capacitor is connected between the first selective boost node and the second input node.

The capacitor nodes may comprise first and second capacitor nodes for connection to opposite sides of the first capacitor and third and fourth capacitor nodes for connection to opposite sides of the second capacitor and wherein the first capacitor node is connected to the first selective boost node and the fourth capacitor node is connected to the second selective boost node. In some examples, the second and third capacitor nodes may be connected to one another.

In some implementations, the network of switching paths may comprises:
- a first input switching path for connecting the first input node to the first selective boost node;
- a second input switching path for connecting the first input node to the second capacitor node;
- a third input switching path for connecting the second input node to the third capacitor node;
- a fourth input switching path for connecting the second input node to the second selective boost node.

In some examples, each of the first, second, third and fourth input switching paths may comprise a respective FET switch.

In some examples, the network of switching paths may comprise a first output switching path for connecting the driver output node to the first selective boost node and a second output switching path for connecting the driver output node to the second selective boost node. Each of the first and second output paths may comprise a plurality of FET switches in series. In some examples there may be a bias controller for each of the first and second output switching paths. Each bias controller may be configured to control a bias voltage between two of said plurality of FETs of the relevant first or second output switching path when the relevant one of the first or second output switching path is not conducting. In some examples, the bias controller for the first output switching path may comprise a transistor for selectively connecting a midpoint node between the first and second capacitors to the relevant one of the first or second output switching paths at a point between said two FETs.

In some examples, the first and second selective boosting nodes may comprise output nodes of a first boosting stage and the switching driver circuit comprises at least one additional boosting stage. Each additional boosting stage may comprise first and second additional capacitors. The network of switching paths may be operable so that the first and second additional capacitors can be selectively connected in series or bypassed in a connection between respective first and second voltage inputs to the additional boosting stage and respective first and second selective boost nodes of the additional boosting stage. Each additional boosting stage may be configured to receive the voltages at the first and second selective boost nodes of a preceding boosting stage at its first and second inputs and the network of switching paths may be configured to selectively connect the output driver node to the selective boost nodes of a last of said additional boosting stages.

In some examples, each additional boosting stage may be further configured to receive, at a third input node, a midpoint voltage from a preceding boosting stage which is midway between the voltages at the first and second selective boost nodes of the preceding boosting stage. The additional boosting stage may be operable to selectively connect the first additional capacitor between the first and third input nodes of that additional boosting stage to charge the first capacitor and to selectively connect the second additional capacitor between the third and second input nodes of that additional boosting stage to charge the second additional capacitor.

The driver circuit may further comprise a controller configured to selectively control the first switching driver so as to controllably vary the operating mode and a duty cycle at which the driver output node is switched between the relevant switching voltages with a duty cycle.

In some implementations the driver circuit may further comprise a second switching driver for generating a second drive signal, the driver circuit being configured to drive a load with the first and second driving signals in a bridge-tied-load configuration. The second switching driver may have the same structure and be operable in the same way as the first switching driver.

Aspects also relate to a driver circuit including a load configured to be driven by the first driving signal. In some examples the load may be connected to the driver output node of the first switching driver via a series inductor. The load may be at least one of an audio output transducer and a haptic output transducer. In some examples the load may be a piezoelectric or ceramic transducer.

Aspects also relate to an electronic device comprising the driver circuit of any of the embodiments described herein.

In another aspect there is provided a switching driver for generating a drive signal, the switching driver comprising:
- first and second voltage input nodes for receiving first and second voltage inputs; capacitor nodes for connection to first and second capacitors;
- a driver output node for outputting the first drive signal; and
- a network of switching paths;
- the switching driver being operable, in use, to:
- selectively drive a first selective boost node to the first voltage input or the first voltage input positively boosted by a voltage of the first capacitor;
- selectively drive a second selective boost node to the second voltage input or the second voltage input negatively boosted by a voltage of the second capacitor; and
- connect the driver output node to a selected one of the first and second selective boost nodes;

wherein the first switching driver is selectively operable in a plurality of different operating modes, wherein in each of said operating mode the driver output node is switched between two switching voltages and the switching voltages are different in each of said modes.

In another aspect there is provided a switching driver for generating a drive signal for driving a load within a defined output voltage range, the switching driver comprising:

first and second voltage input nodes for receiving respective high-side and low-side voltage inputs defining an input voltage;

capacitor nodes for connection to at least one capacitor;

an output node for outputting the drive signal; and a network of switching paths;

wherein the switching driver is operable to generate the driver signal by selectively operating in one of a plurality of different modes, wherein in each of said modes the driver output node is switched between two switching voltages with a controlled duty cycle, wherein the switching voltages are different for each mode and the switching voltages in each mode provide only part of the defined output voltage range.

Aspects also relate to a switching driver for driving a load comprising a switch network for switching driver output node between different switching voltages and capacitor nodes for connection to first and second capacitors, wherein the switch network is operable such that the first capacitor can be selectively connected to provide a positively boosted switching voltage and the second capacitor can be connected to provide a negatively boosted switching voltage.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Figure 1:
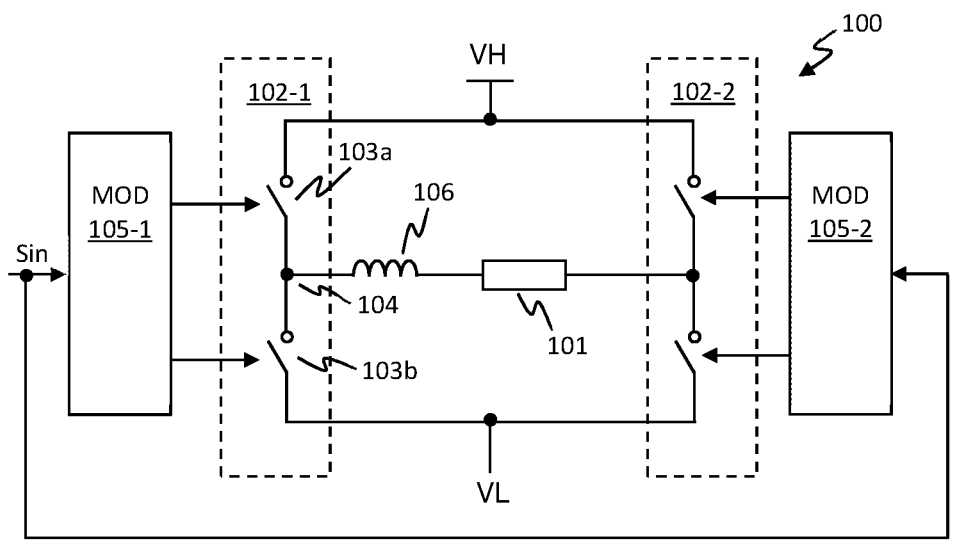
FIG. 1 illustrates one example of a conventional driving circuit.

FIG. 1 illustrates one example of a conventional driver circuitry 100 for driving a load 101. In this example the load 101 is connected in a bridge-tied-load (BTL) configuration and each side of the load is connected to a respective half-bridge switching driver 102-1 and 102-2 (which may be referred to collectively or individually as a switching driver 102). It will be understood, however, that single-ended driving circuits may be used in some implementations, where one side of the load is connected to a switching driver 102 and the other side of the load is coupled, in use, to a defined voltage such as ground.

Each switching driver 102 comprises switches 103a and 103b, which may typically comprise MOSFETs, for selectively connecting an output node 104 to a high-side voltage VH or a low-side voltage VL. In some examples the high-side voltage VH could be a supply voltage and the low-side voltage could be ground.

The switches 103a and 103b of the switching drivers 102 are controlled by switching signals generated by respective modulators 105-1 and 105-2 (which may be referred to collectively or individually as a modulator 105), based on an input signal Sin which may, for instance, be an input audio signal. The modulators 105 may generate PWM or PDM switching signals based on the input signal as will be understood by one skilled in the art.

FIG. 1 also illustrates that the output path from the switching driver 102-1 to the load 101 includes a series inductance 106. The series inductance 106 may be included to suppress the switching ripple of the output voltage and present a high impedance at the output node 104 for the FET switches 103a and 103b at and above the switching frequency, whilst allowing current to flow to the load 101 in the signal band of interest, e.g. at audio frequencies.

As described above, the sizing of the inductor, particularly with respect to the peak current that can flow without saturation, may be limiting in some cases.

As will be understood by the skilled person, the rate of change of current (di/dt) through the inductor is related to the voltage $V_L$ across the inductor and the inductance L as:

$$di/dt = V_L/L \qquad \text{Eqn. (1)}$$

Thus, in general a larger inductance may be required to limit the maximum rate of change of current.

In the example of the conventional driver circuitry of FIG. 1, the high-side voltage VH and low-side voltage VL are selected to provide a certain defined output voltage range for each output switching circuit 102. That is, the switching driver 102-1 is operable to provide an average output voltage, over time, in the range from a voltage at or just above VL (by connecting the output node 104 to VL for substantially the whole of the duty cycle) to voltage at or just below VH (by connecting the output node 104 to VH for substantially the whole of the duty cycle).

Figure 2:
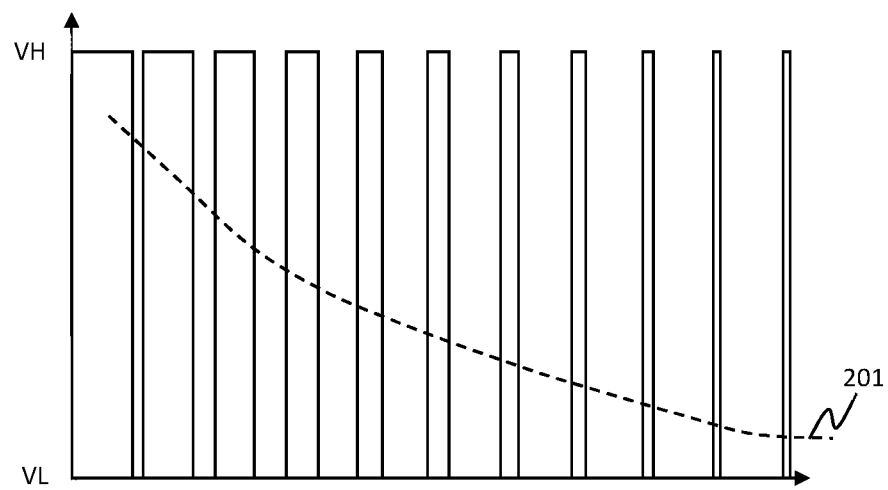
FIG. 2 illustrates output waveforms of one of the switched drivers of FIG. 1.

FIG. 2 illustrates an example of the switching waveform at the output node 104 of the switching driver 102-1 together with the average demand voltage 201, i.e. the desired output signal. The output node 104 switches between the switching voltages VH and VL with the duty-cycle (usually expressed in terms of the proportion of time spent connected to the high-side voltage VH) varying according to the demand voltage 201.

As the output node 104 switches between the switching voltages VH and VL, the inductor current will ramp up or ramp down. The amount of ripple in the inductor current will depend on the duty-cycle of the switching voltages, but also on the difference between the switching voltages VL and VH. A relatively high voltage difference between VL and VH can thus lead to a greater magnitude of current ripple, which can be undesirable.

Embodiments of the present disclosure relate to driver circuitry suitable for driving a transducer that comprise at least one switching driver for generating a driving signal at an output node in a defined output voltage range, where the switching driver is operable in a plurality of different operating modes wherein in each of the different operating modes the output node is switched between two voltages provide only part of the defined output voltage range, that is the voltage range between the two switching voltages in a given mode forms a subset of the defined voltage range.

The switching driver thus switches between two defined switching voltages with a controlled duty cycle to provide a desired average output voltage, where the average output voltage can vary within a defined voltage range between a high voltage VH and a low voltage VL. However, rather than just switch between these peak high and low voltage levels of the output range, as discussed with respect to FIGS. 1 and 2, the switching driver of embodiments of the disclosure switches between two switching voltages which form a subset, or only part, of the full output range. Thus, the output node switches between two switching voltages that differ from one another by less than the full output range.

In effect, the switching driver may be considered to operate with variable voltage rails, where the voltage rails are controllably varied to provide different operating ranges in the different operating modes.

Figure 3:
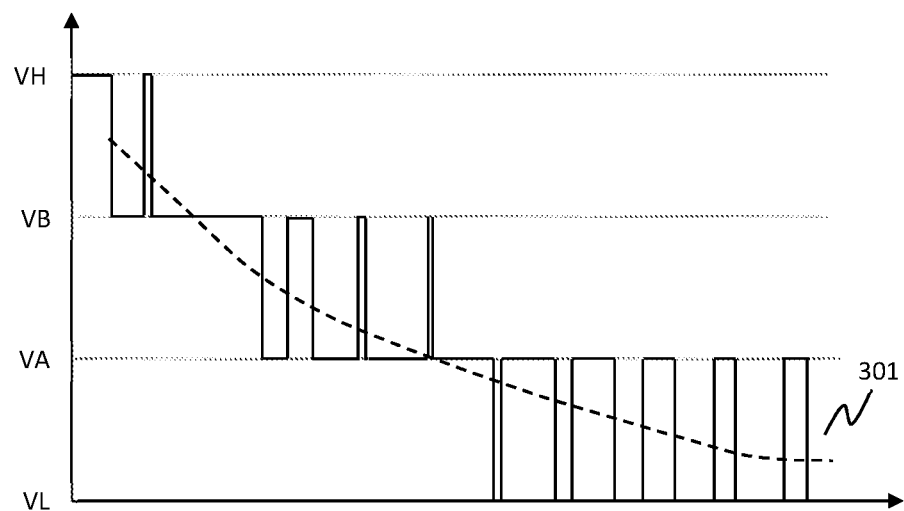
FIG. 3 illustrates example output waveforms of a switched driver according to an embodiment.

FIG. 3 illustrates this principle. FIG. 3 illustrates the switching waveforms at an output node of a switching driver according to one example and the average voltage demand 301. In this example the average voltage demand is the same as that illustrated in FIG. 2 and may vary within a full output range between a low voltage VL and a high voltage VH. In this example, however, the switching driver is operable in different modes. In one mode of operation the output node may be switched between the low voltage VL and a first intermediate voltage VA. In another mode of operation, the output node may be switched between the first intermediate voltage VA and a second intermediate voltage VB. In a further mode of operation, the output node may be switched between the second intermediate voltage VB and the high voltage VH.

When the average voltage demand is lower than the intermediate voltage VA, the output stage may operate in the mode that switches between VL and VA. When the average voltage demand is greater than the first intermediate voltage VA, but lower than the second intermediate voltage, the output node may be switched between VA and VB, and if the voltage demand is above VB, the switching driver may operate in the mode to switch the voltage at the output node between VB and the high voltage VH. In each case, the duty cycle is controlled appropriately to provide the required average voltage.

Operating in this way means that the voltage difference between the two switching voltages used at any time is reduced, compared to the example of FIG. 2. This advantageously reduces the maximum voltage ripple in use.

FIG. 3 illustrates that the full output range between VL and VH is provided by three different operating modes. In at least some embodiments it may be desirable for the voltage range of each operating mode, i.e. the voltage difference between the relevant two switching voltages VL and VA, VA and VB, or VB and VH, to be the same as one another. However, in other embodiments, there may be a different number of operating modes across a full output range of the switching output stage, for instance in some embodiments there may be just two operating modes or there may be more than three operating modes.

Figure 4:
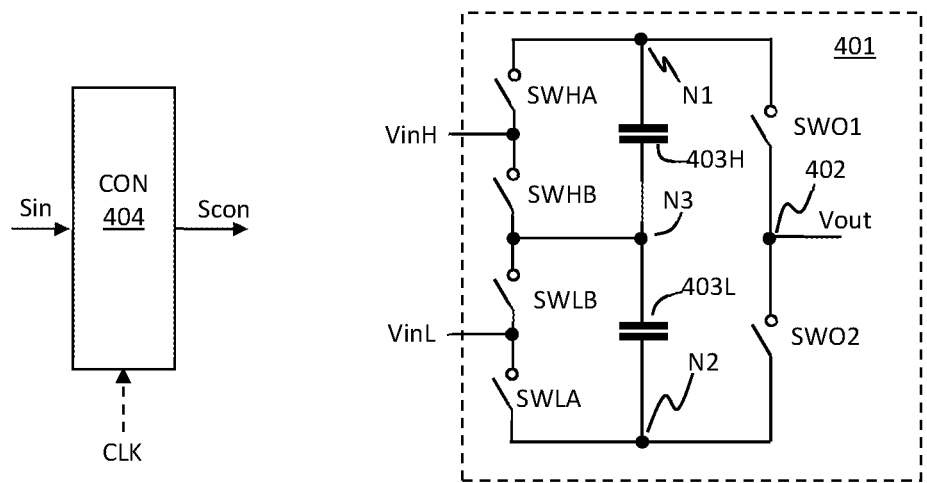
FIG. 4 illustrates one example of a switched driver according to an embodiment.

FIG. 4 illustrates one example of a switching driver 401 according to an embodiment. The switching driver 401 comprises first and second inputs for connection to a high-side voltage VinH and a low-side voltage VinL respectively, for instance a positive supply voltage and ground. It will be understood that the reference to high-side and low-side voltages (or sometimes just high and low voltages) is to indicate that the high-side voltage is relatively more positive than the low-side voltage, and nothing is implied about the magnitudes of such voltages. The difference between the low-side voltage VinL and the high-side voltage VinH defines an input voltage Vin for the output stage. The switching driver 401 also has a driver output node 402 for outputting a drive signal Vout.

The switching driver 401 also comprises first and second capacitors 403H and 403L and a network of switching paths. The network of switching paths is arranged so that the first and second capacitors 403H and 403L can be selectively charged by the input voltage Vin and, in at least one mode of operation, selectively coupled to output node 402 in series with one of the voltage inputs VinH or VinL so as to contribute to output voltage, e.g. to provide a positive or negative boosting of the relevant voltage input. Each switching path comprises one or more switches, which may typically be MOSFETs, as will be described in more detail below.

The first capacitor is connected, on one side, to a first node N1. The network of switching paths includes a switching path SWHA for selectively connecting the first input to the first node N1, by a path which bypassed the first capacitor 403H, so that the first node can be driven to be substantially equal to the high-side voltage VinH. A switching path SWHB is arranged to selectively connect the first input to the first node N1 via a path that includes the first capacitor 403H in series, so that the voltage on this capacitor contributes to the voltage at the node N1. The node N1 can thus be seen as a selective boost node which can be selectively boosted to a voltage above the high-side input voltage.

Similarly, the second capacitor 403L is connected, on one side, to a second node N2 and the network of switching paths includes a switching path SWLA for selectively connecting the second input to a second node N2, bypassing the second capacitor 403L and a switching path SWLB for connecting the second capacitor 403L in series between the second input and the second node N2, so that the voltage on the second capacitor 403L contributes to the voltage at the node N2, in this case by lowering or negatively boosting the voltage. The node N2 can thus be seen as a second selective boost node which can be selectively controlled to be a voltage equal to the low side voltage VinL or a voltage which is lower than the low-side voltage VinL.

Outputs switching paths SWO1 and SWO2 are provided to allow the driver output node 402 to be selectively connected to either the first selective boost node N1 or the second selective boost node N2.

The network of switching paths is also operable to allow the first and second capacitors 403H and 403L to be charged by the input voltage Vin (i.e. the difference between VinH and VinL). In the embodiment of FIG. 3 the capacitors are connected to a common midpoint node N3, and thus the switching paths SWHB and SWLB can be used to selectively connect the first capacitor 403H to the second input or the second capacitor 403L to the first input as will be discussed in more detail below. However, in other arrangements there could be additional switching paths for charging of the capacitors if desired, at the expense of additional circuitry.

It will be understood that the switching driver may be implemented as an integrated circuit (IC), but in some embodiments the first and second capacitors may not comprise integrated components and may be separate components which are connected to the IC in use, i.e. the capacitors may be off-chip. The first capacitor 403H may therefore be connected between first and second capacitor nodes and the second capacitor may be connected between third and fourth capacitor nodes (not separately identified in FIG. 4), which may be connected to suitable contacts of an IC for connection to external capacitors.

The switching driver 401 of FIG. 4 may be operable in three different operating modes. In a first operating mode the output node 402 may be switched between VinH and VinL, so as to provide an average output voltage in the range between VinL and VinH. The first mode can be seen as a non-boosted mode of operation. In a second operating mode, the output node 402 may be switched between VinH and VinH+(VinH−VinL), so as to provide an average output voltage in the range between VinH and 2VinH−VinL, i.e. a voltage range of Vin (=VinH−VinL) above VinH. The second mode can be seen as a positive boosted mode of operation. In a third operating mode, the output node 402 may be switched between VinL and VinL−(VinH−VinL), so as to provide an average output voltage in the range between 2VinL-VinH and VinL, i.e. a voltage range of Vin below VinL. The third mode can be seen as a negative boosting mode of operation.

The output voltage of the switching driver may thus be controlled to have an average value that can take any value within a voltage range equal to three times the input voltage Vin by selectively operating in an appropriate operating mode. Each of the operating modes can provide an average output voltage in a different sub-range, where the magnitude of each sub-range is equal to the input voltage Vin.

FIGS. 5a and 5b, 6a and 6b, and 7a and 7b illustrate operation in the first mode, second and third modes respectively, for an example where the switching driver is connected to receive a supply voltage VS at the first input and is connected to ground, i.e. 0V, at the second input.

Figure 5A:
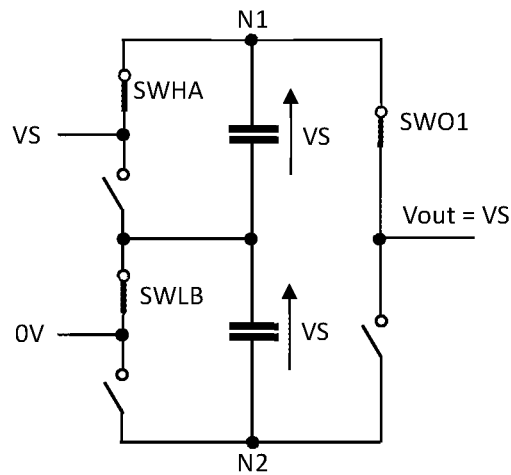
FIGS. 5a and 5b illustrate two states of operation of the switched driver of FIG. 4 in a first mode of operation.
Figure 5B:
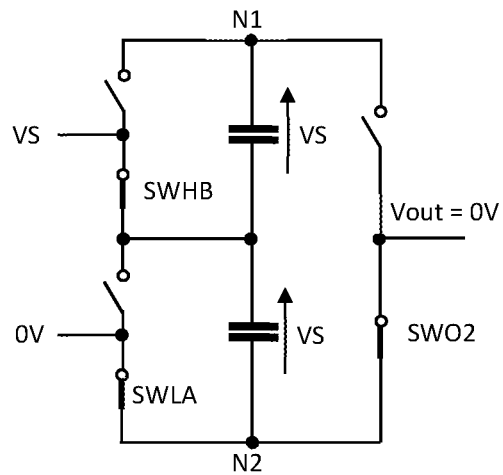

FIGS. 5a and 5b illustrate operation in the first mode. In this first mode the switching driver may be controlled to adopt a first state to provide a voltage equal to +VS at the output node 402, and to adopt a second state to provide a voltage equal to 0V at the output node 402.

FIG. 5a illustrates that in the first state of the first mode, the switches of the switching paths SWHA and SWO1 may be closed to connect the first input to the selective boost node N1, which is connected to the driver output node 402, so that the output voltage Vout is equal, in this example, to +VS. In addition, in this first state the switch(es) of the switching path SWLB are closed to connect the first capacitor 403H between the first and second voltage inputs so as to charge the first capacitor to a voltage of VS. The other switching paths are open and the second capacitor 403L is thus effectively left floating and will maintain its charge.

FIG. 5b illustrates that in the second state of the first mode, the switches of the switching paths SWLA and SWO2 may be closed to connect the second input to the second selective boost node N2 which is connected to the driver output node 402 so the voltage at the driver output node is equal, in this example, to 0V. In addition, in this second state, the switch(es) of the switching path SWHB are closed to connect the second capacitor 403L between the first and second voltage inputs so as to charge the second capacitor to a voltage of VS. The other switching paths are left open and the first capacitor 403H is thus effectively left floating and will maintain its previous charge.

In operation in the first operating mode the switching driver may thus be controlled to alternate between the first and second states with an appropriate duty cycle to provide an output voltage with an average, over the duty cycle, in the range of 0V to VS.

Figure 6A:
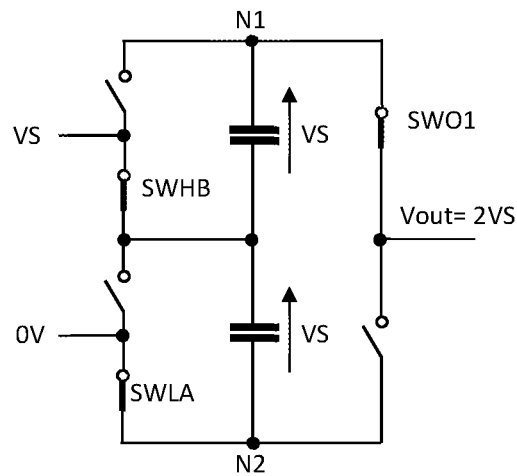
FIGS. 6a and 6b illustrate two states of operation of the switched driver of FIG. 4 in a second mode of operation.
Figure 6B:
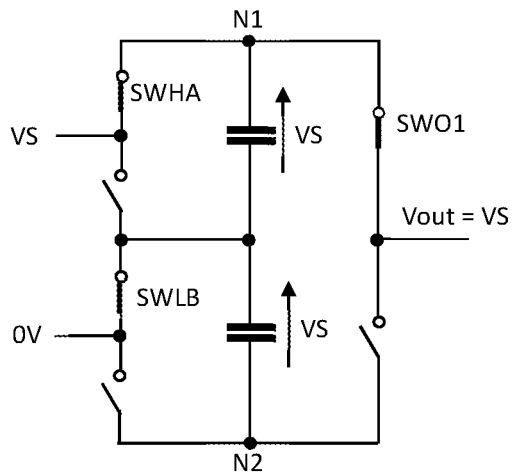

FIGS. 6a and 6b illustrate operation in the second mode. In this second mode the switching driver may be controlled to adopt a first state to provide a voltage equal to +2VS at the output node 402, and to adopt a second state to provide a voltage equal to +VS at the output node 402.

FIG. 6a illustrates that in the first state of the second mode, the switches of the switching paths SWHB may be closed to connect the first input to the selective boost node N1 node via the first capacitor 403H, and the switch(es) of switching path SWO1 closed to connect the first selective boost node to the driver output node 402. In use, the first capacitor 403H will be charged to the input voltage VS during a different state (i.e. the second state of the second mode or one of the states of one of the other operating modes). In this first state of the second mode, the first capacitor is connected with its positive plate coupled to the selective boost node N1 and hence the output node 402 so that the voltage Vout at the output node is equal to +2VS.

In the first state of the second mode, the switch(es) of the switching path SWLA are also closed to connect the second capacitor 403L between the first and second voltage inputs so as to charge the second capacitor to a voltage of VS.

FIG. 6b illustrates that in the second state of the second mode, the switches of the switching paths SWHA and SWO1 may be closed to connect the first input to the first selective boost node N1 which is connected to the output node 402, so the output voltage is equal, in this example, to +VS. In addition, in this second state the switch(es) of the switching path SWLB are closed to connect the first capacitor 403H between the first and second voltage inputs so as to (re-)charge the first capacitor to the voltage of VS. The other switching paths are left open and the second capacitor 403L is thus effectively left floating and will maintain its previous charge.

Figure 7A:
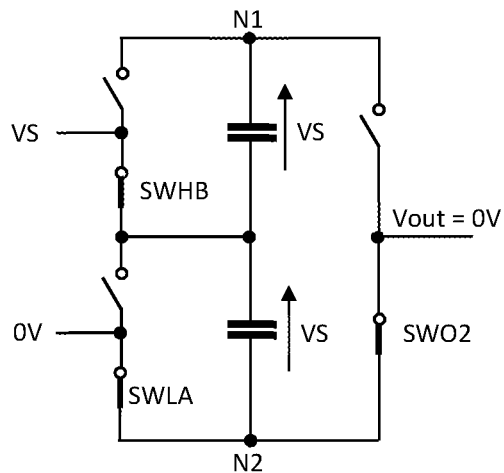
FIGS. 7a and 7b illustrate two states of operation of the switched driver of FIG. 4 in a third mode of operation.
Figure 7B:
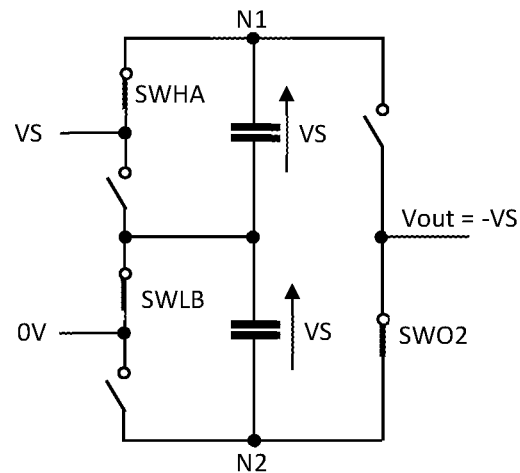

FIGS. 7a and 7b illustrate operation in the third mode. In this third mode the switching driver may be controlled to adopt a first state to provide a voltage equal to 0V at the output node 402, and to adopt a second state to provide a voltage equal to −VS at the output node 402.

FIG. 7a illustrates that in the first state of the third mode, the switches of the switching paths SWLA and SWO2 may be closed to connect the second input to second selective boost node N2 which is connected to the output node 402 so the output voltage is equal, in this example, to 0V. In addition, in this first state, the switch(es) of the switching path SWHB are closed to connect the second capacitor 403L between the first and second voltage inputs so as to charge the first capacitor to the voltage of VS. The other switching paths are left open and the first capacitor 403H is thus effectively left floating and will maintain any previous charge.

FIG. 7b illustrates that in the second state of the third mode, the switch(es) of the switching path SWLB may be closed to connect the second input to the second selective boost node via the second capacitor 403L and switching path SWO2 is closed to connect the second selective boost node to the driver output node 402. As noted above, in use, the second capacitor 403L is charged to the input voltage, which is equal to VS in this example, in one of the other states (i.e. the first state of the third mode or one of the states of one of the other operating modes) and in this second state of the third mode, the second capacitor is connected with its negative plate coupled to the second selective boost node N2 and hence the output node 402 so that the voltage Vout at the output node is equal to −VS.

In this second state of the third mode, the switch(es) of the switching path SWHA are also closed to connect the first capacitor 403H between the first and second voltage inputs so as to charge the first capacitor to a voltage of VS.

It will therefore clear that the switching driver 401 is operable in the three different operating modes to provide an output voltage that may vary within a voltage range equal to 3VS, i.e. between a low voltage of −VS and a high voltage of +2VS. This can be seen as an output voltage symmetric about a midpoint of +0.5VS.

It will be appreciated that to provide the same output voltage range with the conventional driver illustrated in FIG. 1 would require the input voltage VH−VL to be equal to 3VS. Embodiments of the present disclosure can thus provide a given output driving voltage range with a lower input voltage than the conventional approach of FIG. 1, thus reducing the supply voltage requirement.

In each of the second and third modes of operation, one of the capacitors 403H or 403L is coupled in series with the output node 402 in one of the states. The capacitors 403H and 403L may be selected to have a value of capacitance which is sufficient so as to allow the required load current without any significant voltage droop over the course of a switching cycle. The capacitance of capacitors 403H or 403L may also be selected to provide a suitably low effective impedance (as seen as a switched capacitor resistor for driving the load). In some cases, where the load is mostly capacitive, the capacitance of capacitors 403H or 403L may be relatively large compared to the capacitance of the load 101.

It will be noted that in this first mode of operation, in the first state the output node 402 is connected to the supply voltage VS by the switches of the relevant switching paths and the capacitors 403H and 403L are not connected in series between the first input and the output node, and thus the output voltage is provided effectively directly by the supply voltage VS. This is optimum for highly reactive load impedances, where peak current occurs at or near a voltage zero cross.

In each of the modes of operation, the first and second capacitors are charged in alternate states of the duty cycle to the same voltage, which in this example is the input voltage equal to VS. The first and second capacitors 403H and 403L are not used to contribute to the output voltage in this first mode of operation, however operation in the first mode pre-charges the capacitors to the correct voltage level for operation in the other operating modes. Likewise, in the second operating mode the second capacitor 403L is not used to contribute to the output voltage but is pre-charged ready for use in the third operating mode, and in the third operating mode the first capacitor 403H is not used to contribute to the output voltage, but is pre-charged ready for use in the second operating mode. The switching driver can thus be readily switched between the different modes of operation simply by controlling which switches of the switching paths are opened and closed.

It will be noted that the first capacitor 403H is thus only used to contribute to the output voltage in the second mode, to positively boost the voltage at selective boost node N1 to +2VS, and the second capacitor is only used in the third mode of operation, to negatively boost the voltage at the second selective boost node N2 to −VS. If either of these modes of operation were not required for a particular implementation, the relevant one of the first or second capacitor 403H or 403L could be omitted and the output stage just operated in the other two modes.

Referring back to FIG. 4, to control the switching operation to implement the different modes of operation the driver circuitry may comprise a controller 404. The controller may receive the input signal Sin and, based on the input signal Sin, determine the appropriate mode of operation and generate switching control signals Scon for controlling the relevant switches of the switching paths. The controller 404 may generate the switching control signals to alternate between the relevant first and second states with an appropriate duty cycle (taking into account the switching voltages that the output nodes is switched between in the relevant operating mode) so as to provide the desired average output voltage.

A driving circuit could be implemented with a switching driver such as that illustrated in FIG. 4 in a single-ended configuration, i.e. with one switching driver configured to drive one side of a load, with the other side of the load being tied to a fixed voltage, which could for instance be equal to +VS/2.

Figure 8:
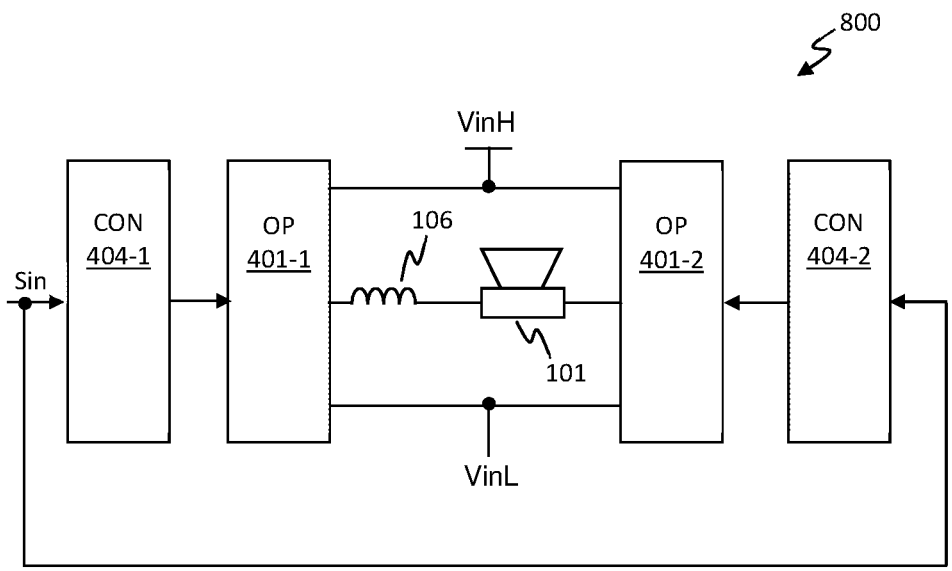
FIG. 8 illustrates an example of a driving circuit according to an embodiment.

In some implementations, however, a driver circuit may comprise two switching drivers arranged to drive a load in a BTL configuration. FIG. 8 illustrates a driving circuit 800 according to an embodiment with respective first and second switching drivers 401-1 and 401-2 for driving the load in a BTL arrangement. Each of the switching drivers 401-1 and 401-2 may be a switching driver such as illustrated in FIG. 4. Each of the switching drivers 401-1 and 401-2 may thus comprise respective first and second capacitors, which allows the mode of operation and duty cycle of the switching drivers 401-1 and 401-2 to be controlled independently of one another.

In the example of FIG. 8 the two switching drivers 401-1 and 401-2 are provided with the same voltage inputs VinH and VinL as one another (and hence each of the switching drivers 401-1 and 401-2 receives the same input voltage). This arrangement is operable to generate drive voltages across the load 101 up to a maximum magnitude of substantially 3(VinH−VinL), i.e. three times the input voltage Vin, by operating the switching driver on one side of the load in the second mode to provide an output voltage of 2VinH−VinL whilst operating the switching driver on the other side of the load in the third mode to provide an output voltage of 2VinL−VinH.

FIG. 8 illustrates that each switching driver 401-1 and 401-2 may be controlled by a respective controller 404-1 and 404-2, although it will be appreciated that at least some of the functionality of the controllers 404-1 and 404-2 may be shared.

Referring back to FIG. 4, each of the switching paths of the switching driver 401 may comprise at least one suitable FET. In some applications each switching path may comprise a single FET switch. In some applications, however, at least some of the switching paths may be implemented by two or more FETs in series, in particular for any switching paths which may be subjected to a higher voltage stress in use in the off or open state, which may be greater than a voltage tolerance of a single FET.

For example, referring back to FIGS. 5a and 5b, in the first state of the first mode, the voltage at selective boost node N1 is +VS, the voltage at midpoint node N3 is 0V and the voltage at selective boost node N2 is equal to −VS (due to the positive plate of the second capacitor 403L being coupled to 0V). The voltage difference across the open switching paths SWHB and SWLA is thus equal in magnitude to VS, but the voltage difference across the switching path SWO2 is 2VS in magnitude. In the second state of the first mode, the negative plate of the first capacitor 403H is coupled to the input voltage VS and so the voltage at the node N1 is equal to +2VS, whilst the voltage at node N3 is +VS and the voltage at node N2 is 0V. In this state the voltage difference across non-conducting switching paths SWHA and SWLB is equal in magnitude to VS, but the voltage difference across switching path SWO1 is 2VS in magnitude.

In the second mode of operation illustrated in FIGS. 6a and 6b, the voltage at selective boost node N1 is +2VS in the first state and +VS in the second state, the voltage at selective boost node N2 is 0V in the first state and −VS in the second state, and the voltage at midpoint node N3 is +VS in the first state and 0V in the second state. In this mode of operation, the voltage difference across the switching path SWO2 is thus equal in magnitude to 2VS, whilst the magnitude of the voltage difference across the other switching paths in the two states is at most equal in magnitude to VS. Likewise, in the third mode of operation illustrated in FIGS. 7a and 7b, the voltages at the nodes N1, N2 and N3 vary in the same way as in the second mode, but in this mode switching path SWO2 remains closed. The voltage difference across switching path SWO1 is thus equal in magnitude to 2VS, whilst the magnitude of the voltage difference across the other switching paths in the two states is at most equal in magnitude to VS.

The switching paths SWO1 and SWO2 which connect to the output node 402, which may be referred to as the output switching paths, may thus be subjected to greater voltage stress in the off state than the other switching paths.

In some implementations the switching driver may be implemented using FETs with a drain-source voltage tolerance which is greater than the magnitude of the input voltage, e.g. the breakdown voltage may be greater than VS in the examples described above. However, it may not be practical or convenient to implement FETs with a voltage tolerance equal in magnitude to 2VS. For instance, in some application the supply voltage VS could be of the order of 20V or so, and FETs rated for operation at 20V may be implemented, but it may not be practical to provide FETs with a voltage tolerance of 40V.

In such an example, the switching paths SWHA, SWHB, SWLA, SWLB may each be implemented with a single suitable FET. However, the voltage difference, in use, across the output switching paths SWO1 and SWO2, when in the off state, may exceed this voltage tolerance. In such a case the output switching paths SWO1 and SWO2 of the switching driver may be implemented by two or more FETs in series, as illustrated in FIG. 9.

Figure 9:
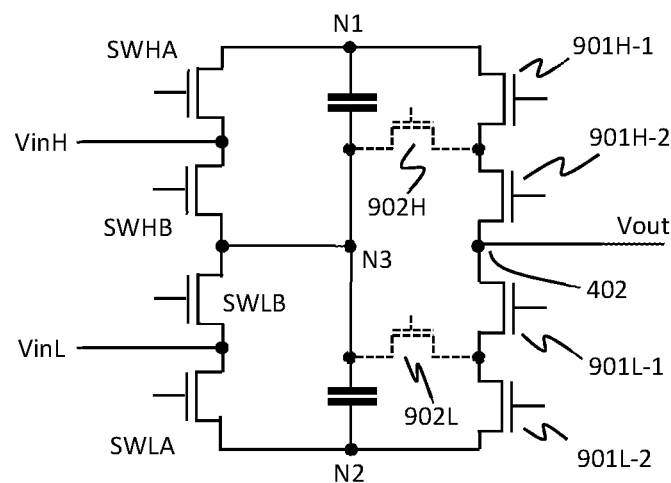
FIG. 9 illustrates one example of an implementation of a switched driver in more detail.

FIG. 9 illustrates that the output switching path SWO1 may be implemented by two FETs 901H-1 and 901H-2 in series and output switching path SWO1 may be implemented by two FETs 901L-1 and 901L-2 in series. In use, when the relevant switching path is in the off state, the voltage difference of magnitude 2VS will apply across the two FETs in series and a voltage stress of magnitude VS may be experienced by each of the series connected FETs.

In some applications, to ensure that the voltage stress is shared correctly across the two FETs of the output path, the voltage at the midpoint between the two FETs of the relevant output path, i.e. the nodes between 901H-1 and 901H-2 and 901L-1 and 901L-2 respectively, may be controlled to a desired voltage when the relevant output path is in the off state. The voltage at such nodes may be controlled by a bias controller so that the voltage stress across each of the FETs, 901H-1 and 901H-2 or 901L-1 and 901L-2 is substantially equal. The voltage at these nodes of the relevant output path may be controlled by a suitable bias controller in variety of ways but in some embodiments, transistors 902H and 902L may be connected between midpoint node N3 and the respective node between the FETs of the output switching paths SWO1 and SWO2. In use, when the relevant switching path is in the off state, the transistor 902H or 902L may be turned-on. This will result in the node between the FETs of the output switching path SWO1 or SWO2 being regulated to a voltage which differs from the output voltage by VS, thus ensuring that voltage stress across each of the FETs 901H-1 and 901H-2 or 901L-1 and 901L-2 is substantially of magnitude VS. The transistors 902H and 902L can be implemented as relatively small devices as they only need to handle relatively small amounts of current during transitions.

FIG. 9 illustrates that the other switching paths SWHA, SWHB, SWLA, SWLB are each implemented with a single FET and thus the embodiment of FIG. 9 uses eight FETs to provide the necessary switching paths.

Referring back to FIG. 4, as discussed above, the switching driver 401 is operable in three modes. In the first mode, which can be seen as a non-boosted mode of operation, the capacitors 403H and 403L are not used to contribute to the voltage at the output node 402, and the output node 402 is alternately connected to the high-side voltage VinH or the low-side voltage VinL in a similar manner to a conventional switching driver. In the second mode of operation, which may be seen as positive boosted mode of operation, the second mode, the voltage at selective boost node N1 can be alternately boosted to VinH+Vin, or just connected to VinH. In the third mode, the voltage at node selective boost node N2 can be alternately boosted or varied to VinL−Vin, or just connected to VinL.

The capacitors 402H and 402L, together with the switching paths SWHA, SWHB, SWLA and SWLB can thus be seen as collectively providing an initial selective boosting stage of the switching driver with the switching paths SWO1 and SWO2 providing an output path stage.

In some embodiments the switching driver may comprise one or more additional selective boosting stages, to allow for further variation in the voltage supplied to the output node, and hence allow more modes of operation and/or a wider output voltage range for a given input voltage. The switching driver may therefore be multi-stage switching driver.

In some examples, one or more additional boosting stages may have the same general structure and operation as described with reference to FIG. 4 and FIGS. 5a-7b.

Figure 10:
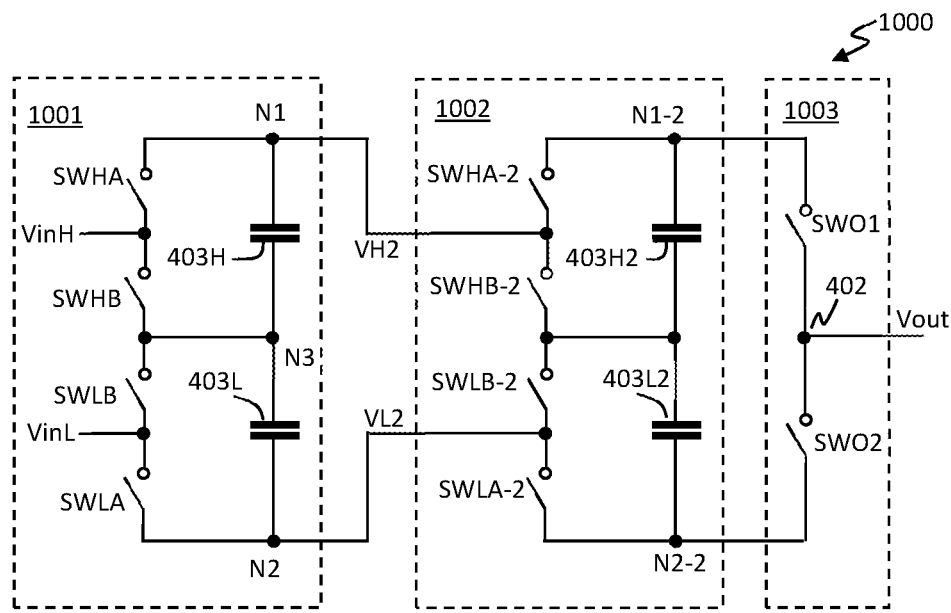
FIG. 10 illustrates an example of a switched driver with multiple boosting stages according to an embodiment.

FIG. 10 illustrates an example of a multi-stage switching driver 1000 according to an embodiment with multiple selective boosting stages. FIG. 10 illustrates an example with two selective boosting stages 1001 and 1002 and an output path stage 1003 but it will be understood that one or more further selective boosting stages could be added in other implementations.

In this embodiment, the first selective boosting stage 1001 has similar components as discussed above with respect to FIG. 4, which are identified by the same reference numerals. The second selective boosting stage 1002 has similar components, which are identified by similar references with a "2" suffix.

In the example of FIG. 10, the voltages at the selective boost nodes N1 and N2 of the first selective boosting stage 1001 are supplied as the respective high-side and low-side voltages VH2 and VL2 for the following selective boosting stage 1001. Given that capacitors 403H and 403L of the first stage 1001 are each charged to the input voltage Vin (=VinH−VinL) and these capacitors are connected in series between N1 and N2, it will be appreciated that the voltage difference between VH2 and VL2 will, in use, be equal to 2Vin.

The switching driver 1000 of FIG. 10 is operable to provide the same outputs of the first, second and third modes described above, but in addition is operable to provide additional boosted modes, which may be referred to as a positive double boosted mode and a negative double boosted mode.

To provide the output of the first mode, i.e. a non-boosted mode of operation, the first stage 1001 and output stage 1003 may together be operated in the same ways as the two states of the first mode described with respect to FIGS. 5a and 5b, whilst the second stage 1002 is simultaneously switched in the same two states. This will connect the output node 402 alternately to the voltage inputs VinH and VinL, whilst charging the capacitors 403H and 403L of the first stage to the input voltage Vin and the capacitors 403H-2 and 403L-2 of the second stage to 2Vin.

To provide the output of the second mode, the first stage 1001 and output stage 1003 may be operated in the two states of the second mode described with reference to FIGS. 6a and 6b. This provides the desired voltage levels at the node N1. The switching path SWHA-2 may be kept closed to connect node N1 to the output node 402 so as to provide the desired output voltages. Switching path SWLB-2 may also be closed to keep capacitor 403H charged. Similarly, to provide the output of the third mode, the first stage 1001 and output stage 1003 may be operated in the two states of the third mode described with reference to FIGS. 7a and 7b to provide the desired voltage levels at the node N2, with the switching path SWL2-2 of the second stage being closed, and switching path SWHB-2 closed to charge capacitor 403L2.

To provide the additional double boosted modes, the first stage 1001 could be operated in the two states of the second or third mode whilst simultaneously operating the second stage 1002 in the same state. For the positive double boosted mode, the output node would thus vary between VinH+Vin and VinH+3Vin. For the negative double boosted mode, the output node would thus vary between VinL−Vin and Vin+3Vin.

Thus, if the input voltages VinH and VinL were a positive supply voltage VS and ground 0V respectively, the switched driver 1000 of FIG. 10 could be selectively operable to provide outputs in the ranges +4VS to +2VS, +2VS to +VS, +VS to 0V, 0V to −VS and −VS to −3VS.

Additional boosting stages could be included if desired, allowing for additional boosting of the voltage for output. It will be understood, however, that the effective input voltage for each stage is double the input voltage of the preceding stage, and the voltage range of the additional boosted mode thus doubles with each stage. This can mean that for some operating modes, the difference between the switching voltages in the relevant mode may be relatively high, with the associated issue of the switching causing relatively high rates of current. Also, the voltages stored by the capacitors of the later boosting stages may be relatively large, which may result in relatively large voltage stresses for some components.

Figure 11:
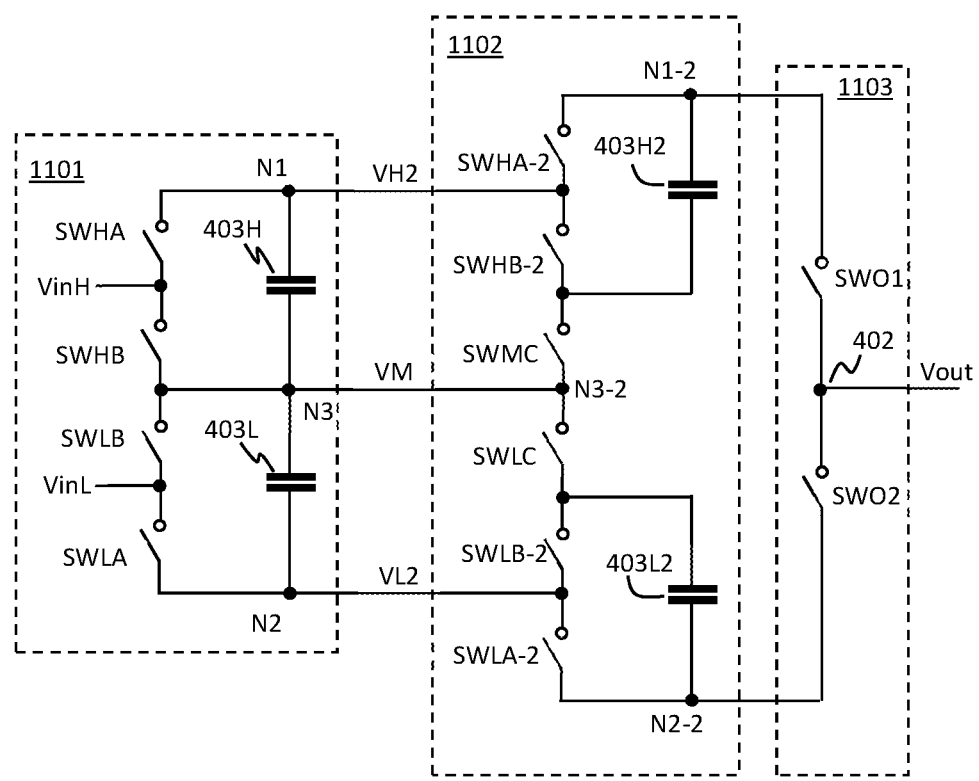
FIG. 11 illustrates another example of a switched driver with multiple boosting stages according to an embodiment.

FIG. 11 illustrates another example of switching driver 1100 with multiple selective boosting stages. FIG. 11 illustrates an example with two selective boosting stages 1101 and 1102 and an output path stage 1003 but it will be understood that one or more further selective boosting stages could be added in other implementations.

The switching driver 1100 has similar components to the switching driver 1000 discussed with respect to FIG. 10, but in the embodiment of FIG. 11, in addition to the voltage VH2 and VL2 from the selective boost nodes N1 and N2 of the first stage being supplied as inputs to the second stage, the second stage also receives the voltage at node N3 of the first stage 1101. The voltage at node N3 is a midpoint voltage VM between the voltages of the selective boost nodes N1 and N2, and thus is always a voltage of Vin below the voltage at node N1 and a voltage Vin above the voltage at node N2. The midpoint voltage VM is used for selectively charging the capacitors 403H and 403L so that these capacitors are charged to a voltage equal to Vin.

The switching driver 1000 of FIG. 10 is operable to provide the same outputs of the first, second and third modes described above, but in addition is operable to provide additional boosted modes, where the voltage may be additionally boosted, positively or negatively, by a voltage of magnitude equal to Vin.

Thus, if the input voltages VinH and VinL were a positive supply voltage VS and ground 0V respectively, the switched driver 1100 of FIG. 11 could be selectively operable to provide outputs in the ranges +3VS to +2VS, +2VS to +VS, +VS to 0V, 0V to −VS and −VS to −2VS.

Additional boosting stages could be included if desired, allowing for additional boosting of the voltage for output.

In general, therefore, embodiments of the present disclosure relate to switching drivers which are suitable for driving an output transducer, that are operable to provide a drive signal with an average voltage within a defined output voltage range, e.g. between a low-side voltage VL and a high-side voltage VH. The switching driver is operable in a plurality of different modes, wherein in each of the modes a driver output node is switched between two switching voltages with a controlled duty cycle, wherein the switching voltages are different for each mode and the switching voltages in each mode provide only part, i.e. a subset, of the defined output voltage range.

In at least some embodiments the switched driver may comprise at least one selective boosting stage having first and second inputs for receiving high-side and low-side input voltages and comprising first and second capacitors and a network of switching paths. The network of switching paths may include a switching path for connecting the first capacitor in series between the first input and a first selective boost node and a switching path for connecting the first input directly to first selective boost node, i.e. not via the first or second capacitor. The first circuit mode may thus be selectively driven to be substantially equal to the high-side input voltage or the high-side input voltage boosted by the voltage of the first capacitor.

The network of switching paths may also include a switching path for connecting the second capacitor in series between the second input and a second selective boost node, and a switching path for connecting the second input directly to the second selective boost node, i.e. not via the first or second capacitor. The second selective boost may thus be selectively driven to be substantially equal to the low-side input voltage or the low-side input voltage boosted negatively by the voltage of the second capacitor.

The switching driver may also comprise an output stage with output paths from selectively connecting an output node of the driver to either the first circuit node or second circuit node of a selective boosting stage.

In each of the modes of operation, the switching driver may be controlled to vary between at least first and second states to provide the different switching voltages, wherein the first capacitor is charged in the first state and the second capacitor is charged in the second state.

At least some embodiments relate to a switching driver for switching a driver output node between switching voltages, in which the switching driver comprises first and second capacitors that can each be selectively charged to defined voltage level, which may, for example, be equal to an input voltage. The switching driver is configured such that the first and second capacitors can be selectively connected to provide voltage boosting for a switching voltage. In at least some embodiments the first capacitor may be selectively connected to provide positive voltage boosting, i.e. to boost the relevant switching voltage to a higher voltage and the second capacitor may be selectively connected to provide negative voltage boosting, i.e. to boost the relevant switching voltage to a lower voltage. Embodiments thus also relate to switching driver circuits that include first and second capacitors for positive and negative voltage boosting respectively.

Embodiments also relate to driver circuitry comprising two switched drivers configured to provide output drive signals for driving a bridge-tied-load.

As mentioned, the switching driver may be suitable for driving an output transducer. The output transducer may be, in some implementations, be an audio output transducer such as a loudspeaker or the like. The output transducer may be a haptic output transducer. In some implementation the output transducer may be driven in series with an inductor, i.e. there may be an inductor in an output path between an output node of the switched driver and the load. In some implementations the transducer may be a piezoelectric or ceramic transducer.

Embodiments may be implemented as an integrated circuit. Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote-control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

The skilled person will recognise that some aspects of the above-described apparatus and methods, for instance aspects of controlling the switching control signals to implement the different modes, may be embodied as processor control code, for example on a non-volatile carrier medium such as a disk, CD- or DVD-ROM, programmed memory such as read only memory (Firmware), or on a data carrier such as an optical or electrical signal carrier. For some applications, embodiments may be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A driver circuit comprising a first switching driver for driving a transducer, the first switching driver comprising:
   an output stage comprising a first driver output node for outputting a first driver signal to drive the transducer and first and second switches for selectively connecting the first driver output node to respective first and second controlled voltage nodes; and
   a voltage stage configured to control voltages at the first and second controlled voltage nodes;
   wherein the first switching driver is configured to be operable in at least first and second modes to modulate the first driver output node between different voltages with a controlled duty-cycle in a switching cycle, wherein:
      in the first mode, the first and second switches are switched with the controlled duty-cycle so that the first driver output node is connected to the first controlled voltage node for part of the switching cycle and is connected to the second controlled voltage node for a different part of the switching cycle; and
      in the second mode, the first switch is closed, with the second switch open, throughout the switching cycle, so that the first driver output node is connected to the first controlled voltage node throughout the switching cycle and the voltage stage modulates the first controlled voltage node between different voltages with said controlled duty-cycle.

2. The driver circuit of claim 1 wherein at least one of the voltages that the first driver node is modulated between, is different in the first mode compared to the second mode.

3. The driver circuit of claim 1 wherein, in the first mode, the first driver output node is modulated between a first voltage and a second voltage, and wherein, in the second mode, the first driver output node is modulated between a second voltage and a third voltage.

4. The driver circuit of claim 3 wherein a voltage difference between the first voltage and the second voltage is the same as a voltage difference between the second voltage and the third voltage.

5. The driver circuit of claim 4 wherein said voltage difference between the first voltage and the second voltage is equal to an input supply voltage for the driver circuit.

6. The driver circuit of claim 3 wherein the first voltage is ground, the second voltage is VS, and the third voltage is 2VS, where VS is a non-zero voltage value.

7. The driver circuit of claim 3 wherein the first voltage is VS, the second voltage is ground, and the third voltage is −VS, where VS is a non-zero voltage value.

8. The driver circuit of claim 1 wherein the first switching driver is configured to be operable in a third mode in which the second switch is closed, with the first switch open, throughout the switching cycle, so that the first driver output node is connected to the second controlled voltage node throughout the switching cycle and the voltage stage modulates the second controlled voltage node with said controlled duty-cycle.

9. The driver circuit of claim 8 wherein:
   in the first mode the first driver output node is modulated between a first voltage and a second voltage;
   in the second mode the first driver output node is modulated between the second voltage and a third voltage; and
   in the third mode the first driver output node is modulated between the first voltage and a fourth voltage.

10. The driver circuit of claim 9 wherein the first voltage is ground, the second voltage is VS, the third voltage is 2VS, and the fourth voltage is −VS where VS is a non-zero voltage value.

11. The driver circuit of claim 1 wherein the first voltage stage comprises at least a first capacitor configured to be charged to a capacitor voltage, wherein in the second mode of operation the first voltage stage is configured to selectively connect said first capacitor into and out of a path to the first controlled voltage node at said controlled duty-cycle.

12. The driver circuit of claim 1 further comprising a controller configured to selectively control the first switching driver so as to control the operating mode and controlled duty cycle based on an input signal.

13. The driver circuit of claim 1 further comprising a second switching driver configured to output a second drive signal at a second driver output node so as to drive the transducer with the first and second driver signals in a bridge-tied-load configuration.

14. The driver circuit of claim 13 wherein the second switching driver has the same structure and is operable in the same way as the first switching driver.

15. The driver circuit of claim 1 configured as an audio driving circuit for driving an audio output transducer.

16. An integrated circuit comprising the driver circuit of claim 1.

17. A driver circuit comprising:
   a first output stage with a first driver output node for outputting a first drive signal for driving a load and at least first and second switches for selectively connecting the first driver output node to respective first and second controlled voltage nodes; and
   a voltage stage configured to control voltages at the first and second controlled voltage nodes;
   the driver circuit being operable in:
      a first mode in which the first and second switches are repeatedly switched with a controlled duty-cycle to alternately connect the first driver output node to different voltages at the first and second controlled voltage nodes; and
      a second mode in which the first switch is maintained closed and the second switch is maintained open and the voltage stage alternates the first controlled voltage node between different voltages with a controlled duty-cycle.

18. A driver circuit comprising:
   a first output stage with a first driver output node for outputting a first drive signal for driving a load and at least first and second switches for selectively connecting the first driver output node to respective first and second controlled voltage nodes;

the driver circuit being operable in:
a first mode in which the first switch is switched with a controlled duty-cycle in a switching cycle and a voltage at the first controlled voltage node is held at a constant nominal value when the first switch is closed; and
a second mode in which the first switch is closed throughout the whole of the switching cycle and the voltage at the first controlled voltage node is modulated between different nominal values when the first switch is closed.

* * * * *